(12) United States Patent
Khanna

(10) Patent No.: US 6,804,133 B1
(45) Date of Patent: Oct. 12, 2004

(54) SELECTIVE MATCH LINE CONTROL CIRCUIT FOR CONTENT ADDRESSABLE MEMORY ARRAY

(75) Inventor: Sandeep Khanna, Santa Clara, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/233,022

(22) Filed: Aug. 30, 2002

(51) Int. Cl.7 .............................................. G11C 15/00
(52) U.S. Cl. ..................... 365/49; 365/189.07
(58) Field of Search ............................. 365/49, 189.07

(56) References Cited

U.S. PATENT DOCUMENTS

| | | | |
|---|---|---|---|
| 4,523,301 A | 6/1985 | Kadota et al. ............... 365/49 |
| 5,359,564 A | 10/1994 | Liu et al. ..................... 365/49 |
| 5,396,449 A | 3/1995 | Atallah ......................... 365/49 |
| 5,483,480 A | 1/1996 | Yoneda ......................... 365/49 |
| 5,517,441 A | 5/1996 | Dietz et al. .................. 365/49 |
| 5,564,052 A | 10/1996 | Nguyen et al. ............. 395/800 |
| 5,617,348 A | * 4/1997 | Maguire ....................... 365/49 |
| 5,706,224 A | 1/1998 | Srinivasan et al. ........... 365/49 |
| 5,740,097 A | 4/1998 | Satoh ........................... 365/49 |
| 5,893,931 A | 4/1999 | Peng et al. ................. 711/206 |
| 5,978,246 A | 11/1999 | Shindo ......................... 365/49 |
| 6,000,008 A | 12/1999 | Simcoe ....................... 711/108 |
| 6,044,005 A | 3/2000 | Gibson et al. ................ 365/49 |
| 6,125,049 A | 9/2000 | Nataraj ........................ 365/49 |
| 6,147,891 A | 11/2000 | Nataraj ........................ 365/49 |
| 6,166,939 A | * 12/2000 | Nataraj et al. ............... 365/49 |
| 6,191,969 B1 | 2/2001 | Pereira ........................ 365/49 |
| 6,191,970 B1 | 2/2001 | Pereira ........................ 365/49 |
| 6,243,280 B1 | 6/2001 | Wong et al. ................. 365/49 |
| 6,262,929 B1 | * 7/2001 | Miyatake et al. ........... 365/203 |
| 6,430,074 B1 | 8/2002 | Srinivasan ................... 365/49 |
| 6,608,771 B2 | * 8/2003 | Jacobson et al. ............ 365/49 |

* cited by examiner

*Primary Examiner*—Huan Hoang
(74) *Attorney, Agent, or Firm*—William L Paradice, III

(57) ABSTRACT

A match line control circuit includes a match line control circuit coupled between a match line of a row of an associated CAM and a supply voltage. The match line control circuit adjusts the charge current for the match line in response to a valid bit and a pre-charge signal. For some embodiments, the match line control circuit includes a dynamic component and a static component to control the match line.

45 Claims, 4 Drawing Sheets

US 6,804,133 B1

SELECTIVE MATCH LINE CONTROL CIRCUIT FOR CONTENT ADDRESSABLE MEMORY ARRAY

FIELD OF INVENTION

This invention relates generally to content addressable memories and specifically to improving performance of content addressable memories.

BACKGROUND

A content addressable memory (CAM) device is a storage device having an array of memory cells that can be instructed to compare the specific pattern of a comparand word with data words stored in corresponding rows of the array. During a compare operation, the comparand word is provided to the CAM array and compared with all the CAM words. For each CAM word that matches the comparand word, a corresponding match line is asserted to indicate the match result. If any of the match lines are asserted, a match flag is asserted to indicate the match condition, and a priority encoder determines the match address or index of the highest priority matching entry in the CAM array.

Typically, the match lines of the CAM array are pre-charged (e.g., to logic high) prior to the compare operation. During the compare operation, if all CAM cells in a row match the comparand data, the CAM cells do not discharge the row's match line, which remains in its charged state to indicate a match condition for the row. Conversely, if any CAM cell in the row does not match the comparand data, the CAM cell discharges the match line (e.g., to logic low) to indicate a mismatch condition for the row. The discharged match lines are pre-charged to the supply voltage for the next compare operation.

Alternately charging and discharging the match lines in a CAM array for compare operations may result in significant power consumption. This power consumption increases as the size and/or density of the CAM array increases and, therefore, undesirably limits the memory size and the scalability of the CAM array. Thus, it would be desirable to reduce the power consumption associated with charging the match lines of a CAM array for compare operations.

BRIEF DESCRIPTION OF THE DRAWINGS

Like reference numerals refer to corresponding parts throughout the drawing figures.

DETAILED DESCRIPTION

A method and apparatus for controlling the match lines of a CAM array are disclosed below in the context of a row 100 of CAM cells for simplicity only. It is to be understood that embodiments of the present invention may be used in any suitable CAM array or device including, for example, either NOR or NAND type CAM arrays. Further, the logic levels assigned to various signals in the description below are arbitrary and, thus, may be modified (e.g., reversed polarity) as desired. Accordingly, the present invention is not to be construed as limited to specific examples described herein but rather includes within its scope all embodiments defined by the appended claims.

Embodiments for controlling the match lines of a CAM array reduce power consumption during compare operations by providing a relatively large match line charge current during a pre-charge phase of the compare operation only for rows containing valid data, and providing a relatively small match line charge current during an evaluation phase of the compare operation. Because the relatively large match line charge current is provided only to rows containing valid data, the match line charging rate is maximized for rows containing valid data while current flow (and thus power consumption) is minimized for rows not containing valid data. The relatively small match line charge current provided during the evaluation phase maintains the match lines indicating a match condition in their charged state to prevent those match lines from inadvertently floating.

Figure 1:
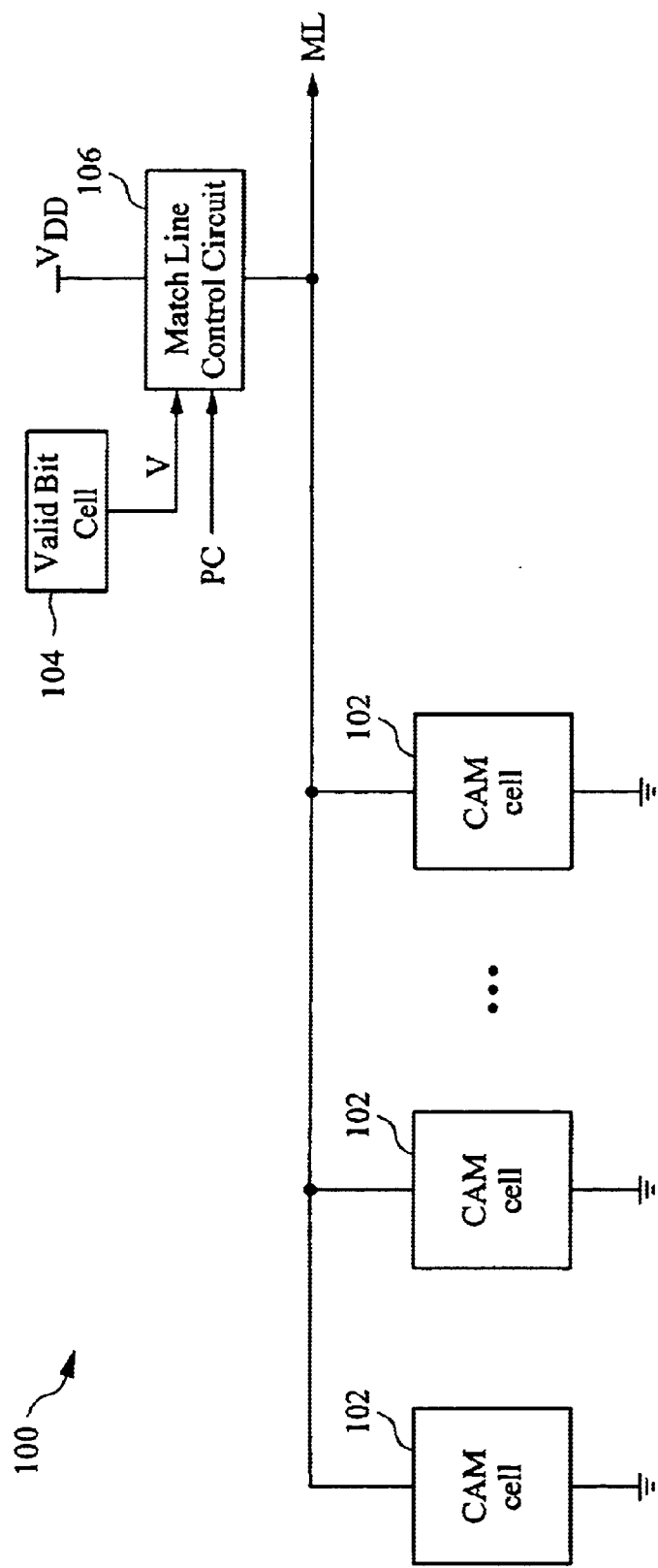
FIG. 1 is a block diagram of a row of a CAM array in accordance with one embodiment of the present invention.

FIG. 1 shows a row 100 of an associated CAM array in accordance with one embodiment of the present invention. Row 100 includes a plurality of CAM cells 102, a valid bit cell 104, and a match line control circuit 106. Each CAM cell 102 includes at least one storage circuit and at least one compare circuit to compare comparand data with data stored in the storage circuit. Each CAM cell is coupled between a match line ML and ground potential. CAM cells 102 are well-known, and may be any suitable binary or ternary CAM cell implemented using Static Random Access Memory (SRAM), Dynamic RAM (DRAM), or non-volatile memory. For simplicity, word lines, bit lines, comparand lines, and other well-known elements of the associated CAM array are not shown in FIG. 1. In addition, various well-known clock, enable, and control signals are not shown in FIG. 1.

Valid bit cell 104 stores an active low valid bit $\overline{V}$ that indicates whether the CAM cells 102 of row 100 store valid data. For one embodiment, $\overline{V}$ is asserted to logic low to indicate that row 100 contains valid data, and is de-asserted to logic high to indicate that row 100 does not contain valid data. Valid bit cell 104 may be any suitable memory element. For some embodiments, valid bit cell 104 is a memory cell such as, for instance, a DRAM, SRAM, Electrically Programmable Read Only Memory (EPROM), or Electrically Erasable Programmable Read Only Memory (EEPROM) cell. For other embodiments, valid bit cell 104 is a well-known CAM cell, and may be coupled between match line ML and ground potential. For one embodiment, valid bit cell 104 is identical to CAM cells 102. Further, although shown in FIG. 1 as including only one valid bit cell 104, row 100 may include additional valid bit cells to store multiple valid bits for row 100.

Match line control circuit 106 is coupled between match line ML and a supply voltage $V_{DD}$, and has inputs to receive the valid signal V (the logical complement of the V-bit stored in valid bit cell 104) and a pre-charge signal PC. V may be generated from $\overline{V}$ using any well-known logic gate such as, for example, a Complementary Metal Oxide Semiconductor (CMOS) inverter. PC may be generated by a clock circuit, an instruction decoder, or other suitable circuit. As explained in detail below, match line control circuit 106 adjusts the charge current for match line ML in response to PC and V to reduce power consumption during compare operations while improving the reliability of match results from such compare operations.

Figure 2:
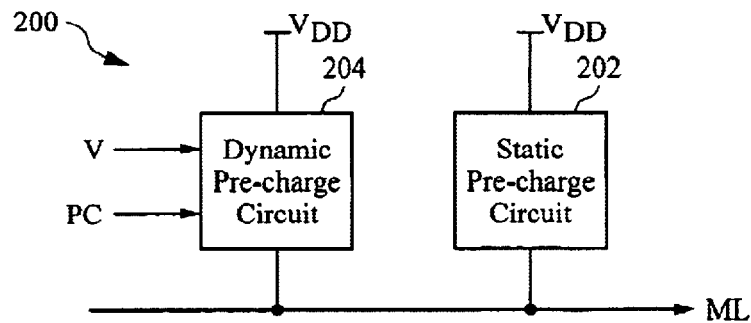
FIG. 2 is a block diagram of one embodiment of the match line control circuit of FIG. 1.

FIG. 2 shows a match line control circuit 200 that is one embodiment of match line control circuit 106 of FIG. 1. Match line control circuit 200 includes a static pre-charge circuit 202 and a dynamic pre-charge circuit 204. Static pre-charge circuit 202 is coupled between $V_{DD}$ and match line ML, and is maintained in a conductive state to continuously charge match line ML toward $V_{DD}$. Because static pre-charge circuit 202 is maintained in a conductive state, static pre-charge circuit 202 may be referred to as a Direct Current (DC) pre-charge circuit. Dynamic pre-charge circuit 204 is coupled between match line ML and $V_{DD}$, and includes inputs to receive PC and V. Dynamic pre-charge circuit 204 selectively pre-charges match line ML towards $V_{DD}$ in response to a logical combination of PC and V. Because dynamic pre-charge circuit 204 selectively pre-charges match line ML, dynamic pre-charge 204 may be referred to as an Alternating Current (AC) pre-charge circuit.

Figure 3:
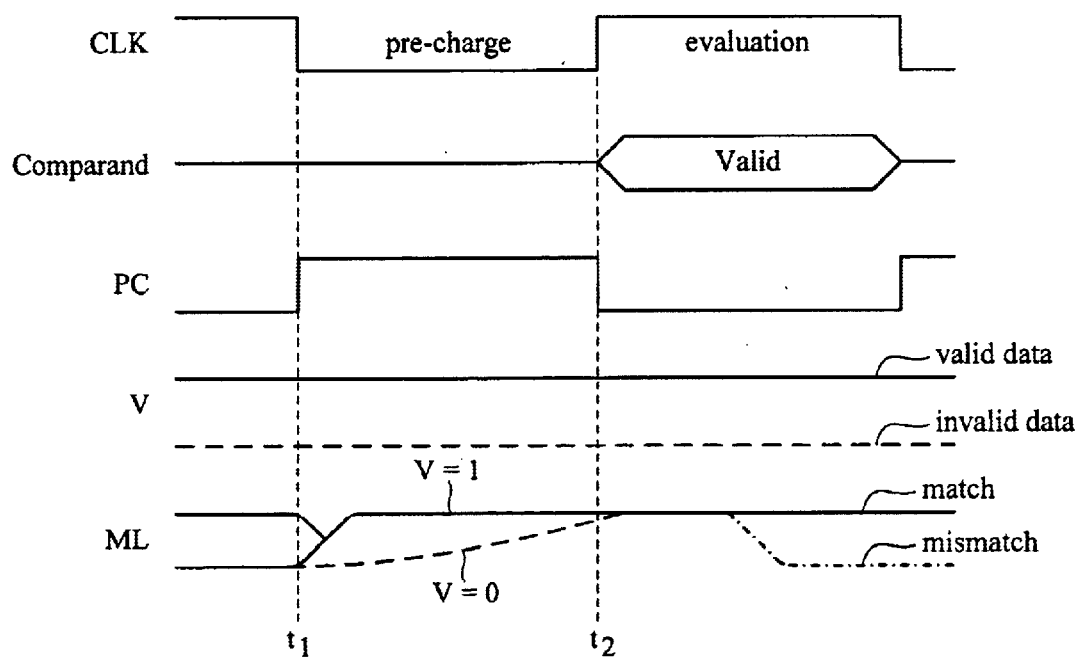
FIG. 3 is a timing diagram illustrating the operation of one embodiment of the match line control circuit of FIG. 2.

An exemplary operation of match line control circuit 200 for a compare operation between a comparand word and data stored in CAM cells 102 is discussed below with respect to the timing diagram of FIG. 3. Static pre-charge circuit 202 is maintained in a conductive state to slowly charge match line ML toward $V_{DD}$. During the pre-charge phase of the compare operation, which corresponds to the system clock CLK transitioning from logic high to logic low at time $t_1$, the comparand word is provided to row 100, and PC is asserted to a logic high state. If row 100 contains valid data, as indicated by a logic high V ($\overline{V}$=0), dynamic pre-charge circuit 204 turns on and quickly charges match line ML by supplementing the charge current provided by static pre-charge circuit 202. Conversely, if row 100 does not contain valid data, as indicated by a logic low. V ($\overline{V}$=1), dynamic pre-charge circuit 204 remains in a non-conductive state and does not supplement the charge current provided by static pre-charge circuit 202.

During the evaluation phase of the compare operation, which corresponds to CLK transitioning from logic low to logic high at time $t_2$, CAM cells 102 become responsive to bit comparisons between the comparand word and data stored in CAM cells 102, and PC is de-asserted to logic low. The de-asserted state of PC disables dynamic pre-charge circuit 204 from charging match line ML, irrespective of whether the row contains valid data. If any of the bit comparisons between the comparand word and the data word stored in row 100 mismatch, the corresponding CAM cell(s) 102 discharge match line ML to ground potential to indicate the mismatch condition. Conversely, if all of the bit comparisons result in matches, CAM cells 102 do not discharge match line ML, which in turn remains in its charged state to indicate the match condition.

For some embodiments, dynamic pre-charge circuit 204 has a much larger current-carrying capacity than does static pre-charge circuit 202. In this manner, selectively enabling dynamic pre-charge circuit 204 during the pre-charge phase of the compare operation significantly boosts the match line charge current for rows containing valid data, thereby increasing the speed with which match comparison results may be generated. Further, because dynamic pre-charge circuit 204 does not charge match line ML if row 100 does not contain valid data, power consumption resulting from match line charging is minimized for rows 100 that do not contain valid data. The power savings realized by selectively enabling and/or disabling dynamic pre-charge circuit 204 during the pre-charge phase of the compare operation are proportional to the percentage of CAM rows that typically contain invalid data.

In addition, by sourcing more of the match line charge current through dynamic pre-charge circuit 204, present embodiments allow the size and current-carrying capacity of static pre-charge circuit 202 to be minimized. Minimizing the current-carrying capacity of static pre-charge circuit 202 minimizes current flow from $V_{DD}$ to ground potential during the evaluation phase of the compare operation for rows having a mismatch condition (e.g., when one or more CAM cells 102 of row 100 discharge match line ML to ground potential), thereby advantageously reducing power consumption for row 100. Moreover, the current flow through static pre-charge circuit 202 may be suitably adjusted so as to maintain match line ML in an acceptable logic high state for rows having a match condition during the evaluation phase of the compare operation, thereby improving data reliability of row 100. For example, without static pre-charge circuit 202 continuously charging match line ML, match lines ML indicating a match condition during the evaluation phase may inadvertently float, which in turn may allow parasitic capacitances in the CAM array to cause undesirable noise on match line ML. This noise, in turn, may result in erroneous signals on match line ML, thereby decreasing data reliability.

The ratio of current-carrying capacities of static pre-charge circuit 202 and dynamic pre-charge circuit 204 may be adjusted depending upon desired operating characteristics, as well as upon the size, type, and specific configuration of the CAM cells 102 and their associated array architecture. The ratio should be sufficient to provide relatively quick charging of match lines for row containing valid data while minimizing power consumption during compare operations. Thus, it is to be understood that the waveforms illustrated for match line ML in FIG. 3 are exemplary; for some embodiments, the charge rate (e.g., slope) for match line ML resulting from static pre-charge circuit 202 and/or dynamic pre-charge circuit 204 may be greater than shown in FIG. 3, while for other embodiments the charge rate for match line ML resulting from static pre-charge circuit 202 and/or dynamic pre-charge circuit 204 may be less than shown in FIG. 3. Similarly, the discharge rate for match line ML may be greater or less than illustrated in FIG. 3.

Note that although PC may be de-asserted simultaneously with CAM cells 102 becoming responsive to bit comparisons at time $t_2$, for some embodiments PC is de-asserted slightly before CAM cells 102 become responsive to bit comparisons so as to avoid current paths to ground through dynamic pre-charge circuit 204 and CAM cells 102 resulting from inadvertent timing mismatches or delays. For some embodiments, PC may be derived from CLK. For other embodiments, PC is a control signal having a pulse width independent of CLK.

Figure 4:
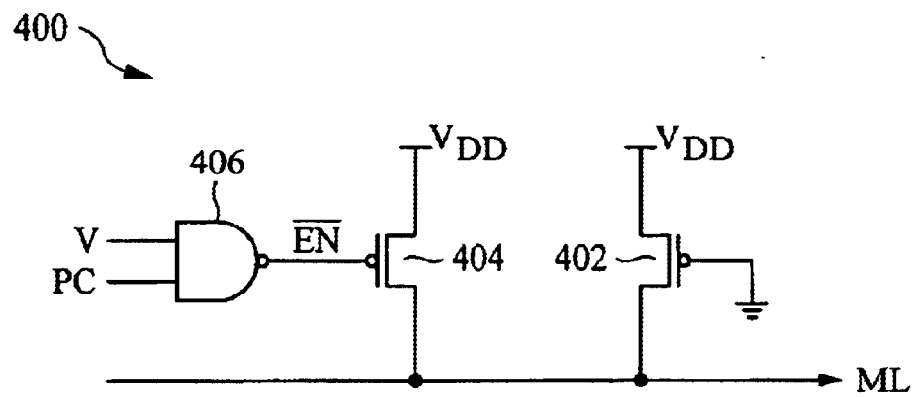
FIG. 4 is a circuit diagram of one embodiment of the match line control circuit of FIG. 2.

FIG. 4 shows a match line control circuit 400 that is one embodiment of match line control circuit 200 of FIG. 2. Match line control circuit 400 includes a relatively weak PMOS pull-up transistor 402 that is one embodiment of static pre-charge circuit 202, and a relatively strong PMOS pull-up transistor 404 and NAND gate 406 that are one embodiment of dynamic pre-charge circuit 204. The gate of weak pull-up transistor 402 is tied to ground potential and thereby maintains transistor 402 in a conductive state. Strong pull-up transistor 404 is coupled in parallel with static pull-up transistor 402 to provide an additional charge path between $V_{DD}$ and match line ML. The gate of strong pull-up transistor 404 receives an active low enable signal EN from an output of NAND gate 406, which includes inputs to receive PC and V.

NAND gate 406 asserts EN to logic low to turn on strong pull-up transistor 404 during the pre-charge phase of the compare operation only if V indicates that row 100 contains valid data. Otherwise, NAND gate 406 de-asserts EN to logic high to turn off strong pull-up transistor 404. Thus, if PC=1 and V=1, NAND gate 406 asserts EN to turn on strong pull-up transistor 404, which in turn supplements the charge current provided by weak pull-up transistor 402 to quickly pre-charge match line ML during the pre-charge phase when row 100 contains valid data. If V=0, NAND gate de-asserts EN to turn off strong pull-up transistor 404, which in turn minimizes charge current during the pre-charge phase when row 100 does not contain valid data. If PC=0, NAND gate 406 de-asserts EN to turn off strong pull-up transistor 404 to minimize current flowing from $V_{DD}$ to ground potential through mismatching CAM cells 102 during the evaluation phase, irrespective of whether row 100 contains valid data.

Strong pull-up transistor 404 has a much larger current-carrying capacity than does relatively weak pull-up transistor 402. For one embodiment, strong pull-up transistor 404 has a gate length of approximately 0.13 microns and weak pull-up transistor 402 has a gate length of approximately 0.8 microns.

Figure 5:
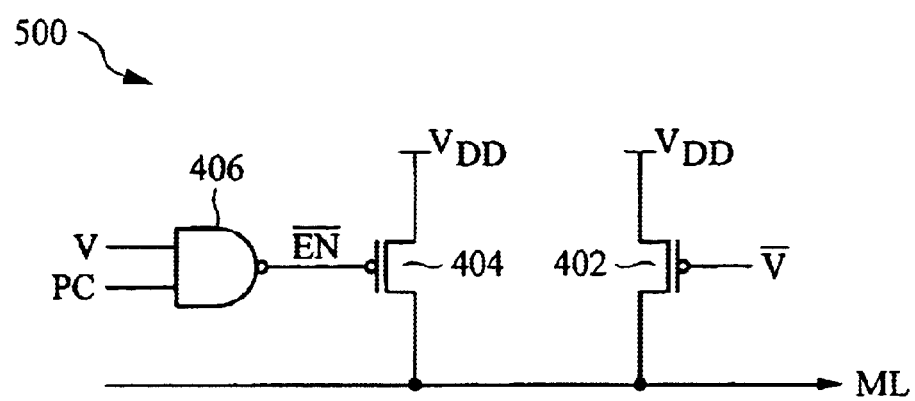
FIG. 5 is a circuit diagram of another embodiment of the match line control circuit of FIG. 2.

For some embodiments, the polarity of pull-up transistors 402 and/or 404 may be suitably reversed in a well-known manner as may be required by specific applications. For instance, in one embodiment, strong pull-up transistor 404 may be an NMOS transistor having a gate coupled to receive a complement EN of the enable signal, and weak pull-up transistor may be an NMOS transistor having a gate tied to $V_{DD}$. For another embodiment, the gate of weak pull-up transistor 402 receives V, as shown in FIG. 5, so that transistor 402 sources a small charge current for match line ML only if the row contains valid data.

Figure 6:
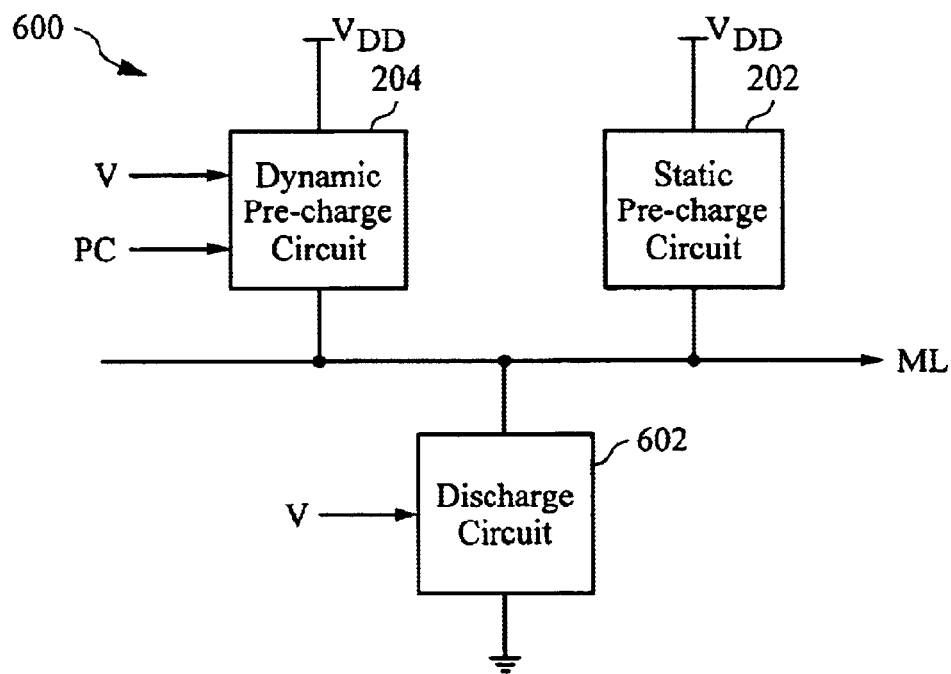
FIG. 6 is a block diagram of another embodiment of the match line control circuit of FIG. 1.

FIG. 6 shows match line control circuit 600 that is another embodiment of match line control circuit 106 of FIG. 1. Match line control circuit 600 includes static pre-charge circuit 202 and dynamic pre-charge circuit 204 of FIG. 2, and also includes a discharge circuit 602. Discharge circuit 602 discharges the match line to a mismatch state if the valid bit indicates that the corresponding row of CAM cells stores invalid data.

Figure 7:
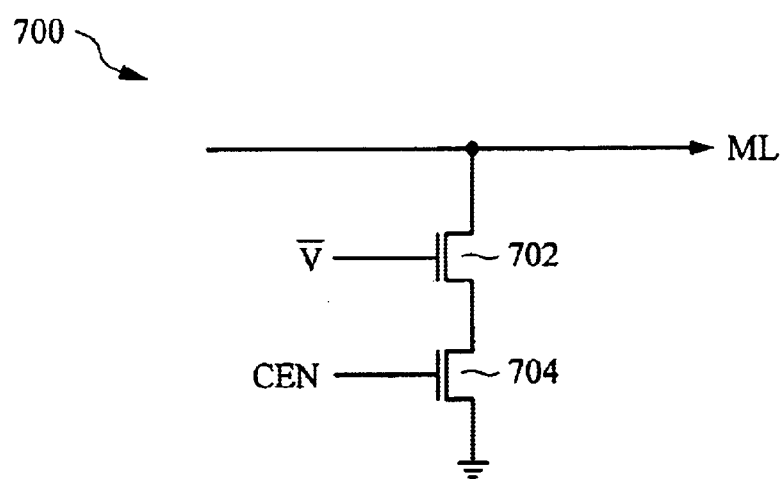
FIG. 7 is a circuit diagram of one embodiment of the discharge circuit of FIG. 6.

FIG. 7 shows discharge circuit 700 that is one embodiment of discharge circuit 602 of FIG. 6. Discharge circuit includes NMOS transistors 702 and 704 coupled in series between the match line and ground potential. Transistor 702 has its gate coupled to V, and transistor 704 has its gate coupled to compare enable signal CEN. CEN is set to an active state during a compare operation. For one embodiment, CEN may be the logical complement of PC. When V=1 indicating that the row stores in invalid data, and CEN=1 during a compare operation, the match line is discharged towards ground potential. If, however, either V (or CEN) is in a logic low state, then the match line will not be discharged by the discharge circuit 700 (but still may be discharged by one of the CAM cells in the row). For an alternative embodiment, transistor 704 may be omitted.

While particular embodiments of the present invention have been shown and described, it will be obvious to those skilled in the art that changes and modifications may be made without departing from this invention in its broader aspects and, therefore, the appended claims are to encompass within there scope all such changes and modifications as fall within the true spirit and scope of this invention. For example, although described above in the context of NOR type CAM arrays, embodiments of the present invention may be used control the match lines for NAND type CAM arrays.

What is claimed is:

1. A content addressable memory (CAM) array having any number of rows, each of the rows comprising:
   a plurality of CAM cells coupled to a match line;
   a valid bit cell for storing a valid bit indicating whether the row contains valid data; and
   a match line control circuit coupled to the match line and having a first input coupled to the valid bit cell and a second input to receive a pre-charge signal, wherein the match line control circuit comprises:
   a static pre-charge circuit coupled between the match line and a supply voltage, the static pre-charge circuit providing a relatively small charge current for the match line; and
   a dynamic pre-charge circuit coupled between the match line and the supply voltage, the dynamic pre-charge circuit selectively providing a relatively large pre-charge current for the match line in response to a logical combination of the valid bit and the pre-charge signal.

2. The CAM array of claim 1, wherein the valid bit cell comprises a memory cell.

3. The CAM array of claim 1, wherein the valid bit cell comprises a CAM cell.

4. The CAM array of claim 1, wherein the match line control circuit adjusts a charge current for the match line in response to the logical combination of the valid bit and the pre-charge signal.

5. The CAM array of claim 4, wherein during a pre-charge phase of a compare operation the match line control circuit maximizes the charge current if the row contains valid data and minimizes the charge current if the row does not contain valid data.

6. The CAM array of claim 5, wherein during an evaluation phase of the compare operation the match line control circuit minimizes the charge current.

7. The CAM array of claim 1, wherein the static pre-charge circuit is responsive to the valid bit.

8. The CAM array of claim 1, wherein the dynamic pre-charge circuit is enabled to pre-charge the match line during a pre-charge phase of a compare operation only if the row contains valid data.

9. The CAM array of claim 8, wherein the dynamic pre-charge circuit is disabled during the pre-charge phase of the compare operation if the row does not contain valid data.

10. The CAM array of claim 9, wherein the dynamic pre-charge circuit is disabled during an evaluation phase of the compare operation.

11. The CAM array of claim 1, wherein the static pre-charge circuit charges the match line during the evaluation phase of the compare operation.

12. The CAM array of claim 1, wherein the match line control circuit comprises a discharge circuit coupled between the match line and ground.

13. The CAM array of claim 12, wherein the discharge circuit comprises a first transistor coupled between the match line and ground and having a gate coupled to the valid bit.

14. The CAM array of claim 13, wherein the discharge circuit further comprises a second transistor coupled between the match line and ground and having a gate coupled to receive a signal indicative of when a compare operation is taking place in the CAM array.

15. The CAM array of claim 1, wherein the dynamic pre-charge circuit comprises:
a first transistor coupled between the supply voltage and the match line, and having a gate; and
a logic gate having a first input to receive the valid bit, a second input to receive the pre-charge signal, and an output coupled to the gate of the first transistor.

16. The CAM array of claim 15, wherein the logic gate comprises a NAND gate.

17. The CAM array of claim 1, wherein the static pre-charge circuit comprises:
a first transistor coupled between the supply voltage and the match line, and having a gate coupled to receive the valid bit.

18. The CAM array of claim 1, wherein the static pre-charge circuit comprises:
a first transistor coupled between the supply voltage and the match line, and configured to remain in a conductive state.

19. A content addressable memory (CAM) array having any number of rows, each of the rows comprising:
a plurality of CAM cells coupled to a match line;
a valid bit cell for storing a valid bit indicating whether the row contains valid data;
means for selectively providing a relatively large pre-charge current for the match line during a pre-charge phase of a compare operation in response to the valid bit and a pre-charge signal; and
means for providing a relatively small charge current for the match line during an evaluation phase of the compare operation.

20. The CAM array of claim 19, wherein the means for providing a relatively small charge current is responsive to the valid bit.

21. The CAM array of claim 19, wherein the means for selectively providing a relatively large pre-charge current is disabled during the evaluation phase of the compare operation.

22. The CAM array of claim 21, wherein the means for providing a relatively small charge current is disabled if the row does not contain valid data.

23. The CAM array of claim 19, wherein:
the means for providing a relatively small charge current comprises a first transistor coupled between the match line and a supply voltage, and configured to remain in a conductive state; and
the means for selectively providing a relatively large pre-charge current comprises a second transistor coupled between the match line and the supply voltage, and a logic gate having a first input to receive the valid bit, a second input to receive the pre-charge signal, and an output coupled to a gate of the second transistor.

24. The CAM array of claim 23, further comprising:
means for selectively discharging the match line in response to the valid bit.

25. A content addressable memory (CAM) array having any number of rows, each of the rows comprising:
a plurality of CAM cells coupled to a match line;
a valid bit cell for storing a valid bit indicating whether the row contains valid data;
means for pre-charging the match line during a pre-charge phase of a compare operation only if the valid bit indicates that the row contains valid data; and
means for charging the match line during an evaluation phase of the compare operation.

26. The CAM array of claim 25, wherein the means for pre-charging is disabled during the evaluation phase of the compare operation.

27. The CAM array of claim 25, wherein the means for charging is disabled if the row does not contain valid data.

28. The CAM array of claim 25, wherein:
the means for charging comprises a first transistor coupled between the match line and a supply voltage, and configured to remain in a conductive state; and
the means for pre-charging comprises a second transistor coupled between the match line and the supply voltage, and a logic gate having a first input to receive the valid bit, a second input to receive the pre-charge signal, and an output coupled to a gate of the second transistor.

29. The CAM array of claim 25, further comprising:
means for selectively discharging the match line in response to the valid bit.

30. A method for controlling a match line of a corresponding row of a content addressable memory (CAM) array during a compare operation, the row including a valid bit indicative of whether valid data is stored therein, comprising:
providing the valid bit to a match line control circuit associated with the row;
providing a pre-charge signal to the match line control circuit;
providing a relatively large pre-charge current for the match line if the valid bit is asserted and the pre-charge signal is asserted; and
providing a relatively small charge current for the match line, irrespective of the pre-charge signal.

31. The method of claim 30, wherein the pre-charge signal is asserted during a pre-charge phase of the compare operation and is de-asserted during an evaluation phase of the compare operation.

32. A method for controlling a match line of a corresponding row of a content addressable memory (CAM) array during a compare operation, comprising:
pre-charging the match line during a pre-charge phase of the compare operation in response to a pre-charge signal only if the row contains valid data; and
charging the match line during an evaluation phase of the compare operation.

33. The method of claim 32, further comprising:
discharging the match line during the pre-charge phase if the row does not contain valid data.

34. The method of claim 32, further comprising:
not charging the match line during the pre-charge phase if the row does not contain valid data.

35. The method of claim 32, further comprising:
not charging the match line during the evaluation phase if the row does not contain valid data.

36. A method for controlling a match line of a corresponding row of a content addressable memory (CAM) array during a compare operation, comprising:
enabling a dynamic pre-charge circuit to pre-charge the match line during a pre-charge phase of the compare operation if the row contains valid data;
disabling the dynamic pre-charge circuit during an evaluation phase of the compare operation; and
enabling a static pre-charge circuit to charge the match line during the compare operation.

37. The method of claim 36, further comprising:
disabling the dynamic pre-charge circuit during the pre-charge phase if the row does not contain valid data.

38. The method of claim 36, further comprising:

disabling the static pre-charge circuit if the row does not contain valid data.

39. A content addressable memory (CAM) array having any number of rows, each of the rows comprising:

a plurality of CAM cells coupled to a match line;

a valid bit cell for storing a valid bit indicating whether the row contains valid data; and a match line control circuit coupled to the match line and having a first input coupled to the valid bit cell and a second input to receive a pre-charge signal, wherein during an evaluation phase of a compare operation the match line control circuit is configurable to provide a relatively small match line charge current.

40. The CAM array of claim 39, wherein the match line control circuit comprises:

a static pre-charge circuit coupled between the match line and a supply voltage; and a dynamic pre-charge circuit coupled between the match line and the supply voltage, and having inputs to receive the pre-charge signal and the valid bit.

41. The CAM array of claim 40, wherein the dynamic pre-charge circuit is enabled to pre-charge the match line during a pre-charge phase of the compare operation only if the row contains valid data.

42. The CAM array of claim 41, wherein the dynamic pre-charge circuit is disabled during the pre-charge phase of the compare operation if the row does not contain valid data.

43. The CAM array of claim 42, wherein the dynamic pre-charge circuit is disabled during the evaluation phase of the compare operation.

44. The CAM array of claim 40, wherein the static pre-charge circuit charges the match line during the evaluation phase of the compare operation.

45. The CAM array of claim 40, wherein the static pre-charge circuit is responsive to the valid bit.

\* \* \* \* \*